(12) United States Patent
Yuan et al.

(10) Patent No.: US 11,545,508 B2
(45) Date of Patent: Jan. 3, 2023

(54) DISPLAY PANEL AND FABRICATION METHOD THEREOF, AND DISPLAY DEVICE

(71) Applicant: XIAMEN TIANMA MICRO-ELECTRONICS CO., LTD., Xiamen (CN)

(72) Inventors: Yong Yuan, Shanghai (CN); Heeyol Lee, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 575 days.

(21) Appl. No.: 16/447,044

(22) Filed: Jun. 20, 2019

(65) Prior Publication Data

US 2020/0312886 A1 Oct. 1, 2020

(30) Foreign Application Priority Data

Mar. 25, 2019 (CN) .......................... 201910228922.0

(51) Int. Cl.
*H01L 27/12* (2006.01)
*H01L 25/16* (2006.01)
*H01L 51/56* (2006.01)
*H01L 27/32* (2006.01)
*H01L 51/00* (2006.01)

(52) U.S. Cl.
CPC ........ *H01L 27/1218* (2013.01); *H01L 25/167* (2013.01); *H01L 27/124* (2013.01); *H01L 27/1266* (2013.01); *H01L 27/3248* (2013.01); *H01L 27/3276* (2013.01); *H01L 51/0097* (2013.01); *H01L 51/56* (2013.01); *H01L 2227/323* (2013.01); *H01L 2227/326* (2013.01); *H01L 2251/5338* (2013.01)

(58) Field of Classification Search
CPC . H01L 25/167; H01L 27/1218; H01L 27/124; H01L 27/1266; H01L 27/3248; H01L 27/3276; H01L 51/0097; H01L 51/56; H01L 2227/323; H01L 2227/326; H01L 2251/5338; G09G 3/035
See application file for complete search history.

(56) References Cited

U.S. PATENT DOCUMENTS

| | | | |
|---|---|---|---|
| 2016/0300853 A1* | 10/2016 | Yamazaki | G09G 3/035 |
| 2018/0247994 A1* | 8/2018 | Seo | H01L 27/3276 |
| 2019/0259822 A1* | 8/2019 | Jeon | H01L 27/3262 |

FOREIGN PATENT DOCUMENTS

CN 102982744 A 3/2013

* cited by examiner

*Primary Examiner* — David C Spalla
(74) *Attorney, Agent, or Firm* — Anova Law Group, PLLC

(57) ABSTRACT

A display panel includes a first flexible substrate, and a metal wiring layer located on the first flexible substrate. The metal wiring layer includes at least one first power-supply line. At least one binding region is disposed on the side of the first flexible substrate away from the metal wiring layer. The display panel also includes a thin-film transistor layer, located on the side of the metal wiring layer away from the first flexible substrate and including a plurality of first thin-film transistors. Each first thin-film transistor includes a first electrode electrically connected to the first power-supply line. The display panel further includes a first conductive layer, including a plurality of conductive sections. The plurality of conductive sections is located in the binding region, and the first power-supply line is electrically connected to at least one conductive section of the plurality of conductive sections.

13 Claims, 15 Drawing Sheets

DISPLAY PANEL AND FABRICATION METHOD THEREOF, AND DISPLAY DEVICE

CROSS-REFERENCES TO RELATED APPLICATIONS

This application claims the priority of Chinese patent application No. 201910228922.0, filed on Mar. 25, 2019, the entirety of which is incorporated herein by reference.

FIELD OF THE DISCLOSURE

The present disclosure generally relates to the field of display technology and, more particularly, relates to a display panel and fabrication method thereof, and a display device.

BACKGROUND

In many occasions such as theaters, conference rooms, and outdoors, large-screen displays are often used. Because the display area of a large-screen display is exceptionally large, forming such a large display area by splicing multiple displays with small display areas together is a method that is generally adopted. Accordingly, the image to be displayed is divided into multiple portions using an image splitter, and these multiple portions are respectively transmitted to the multiple displays with small display areas for display.

A display with a small display area usually includes a display region and a binding region. In the binding region, the signal lines of the display region need to be connected to an integrated circuit (IC), e.g., a driving chip and/or a flexible printed circuit (FPC) board, such that the corresponding electrical signals can be provided to the signal lines of the display region through the driving chip and/or the FPC board. As such, pictures can be displayed in the display region. However, according to existing technology, the display region and the binding region are usually disposed on the same side of the display. Therefore, after splicing multiple displays together, the display regions of the adjacent displays may be separated by a binding region, and thus a wide splicing seam may be formed between two adjacent displays. The presence of these splicing seams may affect the continuity of the image to be displayed, making it difficult for a large screen display to achieve the desired visual effect when displaying the image.

To this end, a current solution is mainly to design displays with small display areas as flexible displays, and bend the binding regions of the flexible displays to a certain angle before splicing them together. However, a splicing seam with a certain width may still be inevitably formed between adjacent flexible displays. In many occasions where the requirements on the visual effect are high, the large screen display obtained by splicing flexible displays together may still not be able to meet the requirements.

The disclosed display panel and fabrication method thereof as well as the disclosed display device are directed to solve one or more problems set forth above and other problems in the art.

BRIEF SUMMARY OF THE DISCLOSURE

One aspect of the present disclosure provides a display panel. The display panel includes a first flexible substrate, and a metal wiring layer located on a side of the first flexible substrate. The metal wiring layer includes at least one first power-supply line, and at least one binding region is disposed on the side of the first flexible substrate away from the metal wiring layer. The display panel also includes a thin-film transistor layer, located on the side of the metal wiring layer away from the first flexible substrate and including a plurality of first thin-film transistors. Each first thin-film transistor of the plurality of first thin-film transistors includes a first electrode electrically connected to the at least one first power-supply line. The display panel further includes a first conductive layer, including a plurality of conductive sections. The plurality of conductive sections is located in the at least one binding region, and the at least one first power-supply line is electrically connected to at least one conductive section of the plurality of conductive sections.

Another aspect of the present disclosure provides a method for fabricating a display panel. The method includes providing a glass substrate; forming a sacrificial layer on the glass substrate; forming a first conductive layer on the sacrificial layer; forming a plurality of conductive sections by patterning the first conductive layer; sequentially forming a first flexible substrate and a metal wiring layer on the first conductive layer; and forming at least one first power-supply line by patterning the metal wiring layer. At least one binding region is disposed on the side of the first flexible substrate away from the metal wiring layer, the plurality of conductive sections is located in the at least one binding region, and the at least one first power-supply line is electrically connected to at least one conductive section of the plurality of conductive sections. The method also includes forming a thin-film transistor layer on the metal wiring layer. The thin-film transistor layer includes a plurality of first thin-film transistors, and each first thin-film transistor of the plurality of first thin-film transistors includes a first electrode electrically connected to the at least one first power-supply line. The method further includes removing the sacrificial layer from the plurality of conductive sections and the first flexible substrate.

Another aspect of the present disclosure provides another method for fabricating a display panel. The method includes providing a glass substrate; forming a second flexible on the glass substrate; forming a first conductive layer on the second flexible substrate; forming a plurality of conductive sections by patterning the first conductive layer; sequentially forming a first flexible substrate and a metal wiring layer on the first conductive layer; and forming at least one first power-supply line by patterning the metal wiring layer. At least one binding region is disposed on the side of the first flexible substrate away from the metal wiring layer, the plurality of conductive sections is located in the at least one binding region, and the at least one first power-supply line is electrically connected to at least one conductive section of the plurality of conductive sections. The method also includes forming a thin-film transistor layer on the metal wiring layer. The thin-film transistor layer includes a plurality of first thin-film transistors, and each first thin-film transistor of the plurality of first thin-film transistors includes a first electrode electrically connected to the at least one first power-supply line. The method further includes removing the glass substrate from the second flexible substrate and patterning the second flexible substrate to form at least one trench exposing at least a portion of the plurality of conductive sections.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Various exemplary embodiments of the present disclosure will now be described in detail with reference to the accompanying drawings. It should be noted that the relative arrangement of the components and steps, numerical expressions and numerical values set forth in the embodiments are not intended to limit the scope of the present disclosure. The following description of the at least one exemplary embodiment is merely illustrative, and by no means can be considered as limitations for the application or use of the present disclosure.

It should be noted that techniques, methods, and apparatuses known to those of ordinary skill in the relevant art may not be discussed in detail, but where appropriate, the techniques, methods, and apparatuses should be considered as part of the specification.

In all of the examples shown and discussed herein, any specific values should be considered as illustrative only and not as a limitation. Therefore, other examples of exemplary embodiments may have different values.

It should be noted that similar reference numbers and letters indicate similar items in subsequent figures, and therefore, once an item is defined in a figure, it is not required to be further discussed or defined in the subsequent figures.

Figure 1:
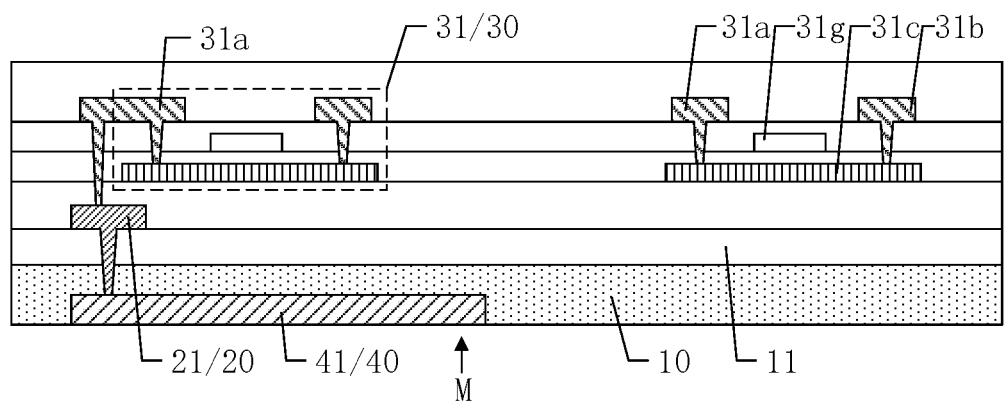
FIG. 1 illustrates a schematic view of an exemplary display panel according to various embodiments of the present disclosure.

The present disclosure provides a display panel. FIG. 1 illustrates a schematic view of an exemplary display panel according to various embodiments of the present disclosure, and FIG. 2 illustrates a schematic view of the display panel shown in FIG. 1 along an M direction.

Figure 2:
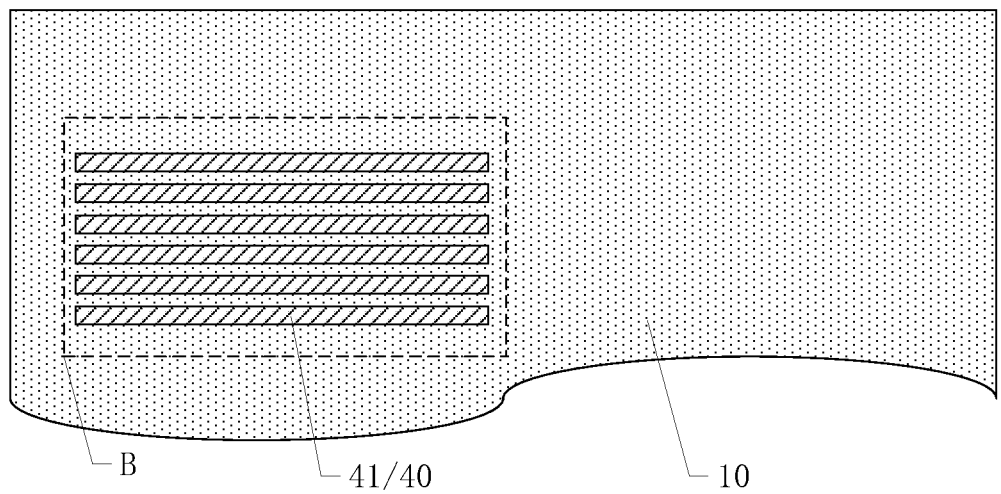
FIG. 2 illustrates a schematic view of the display panel shown in FIG. 1 along an M direction.

Referring to FIGS. 1-2, the display panel may include a first flexible substrate 10, and a metal wiring layer 20. The metal wiring layer 20 may be located on a side of the first flexible substrate 10, and may include at least one first power-supply line 21. At least one binding region B may be disposed on the side of the first flexible substrate 10 that is away from the metal wiring layer 20.

The display panel may also include a thin-film transistor layer 30. The thin-film transistor layer 30 may be located on the side of the metal wiring layer 20 that is away from the first flexible substrate 10. The thin-film transistor layer 30 may include a plurality of first thin-film transistors 31. A first electrode 31a of each first thin-film transistor 31 may be electrically connected to the at least one first power-supply line 21.

The display panel may further include a first conductive layer 40. The first conductive layer 40 may include a plurality of conductive sections 41. The plurality of conductive sections 41 may be located in the binding region B, and each first power-supply line 21 may be electrically connected to at least one conductive section 41.

For example, as the substrate of the display panel, the first flexible substrate 10 may have the characteristics of being flexible, deformable, bendable, etc. The first flexible substrate 10 may be made of a material including at least one of polyimide, polycarbonate, polyethersulfone, polyethylene terephthalate (PET), polyethylene naphthalate (PEN), polyarylate glass-fiber reinforced plastic, and other appropriate polymer materials.

In one embodiment, the display panel may include a plurality of pixel units arranged in an array, and each pixel unit of the plurality of pixel units may include at least two sub-pixels. The brightness of each sub-pixel of a pixel unit may be separately controlled such that a mixed color of the pixel unit with different brightness may be displayed. Further, pictures can be displayed by controlling the plurality of pixel units to display different colors and/or different brightness. In order to drive the sub-pixels separately, a certain number of thin-film transistors (TFTs) may need to be disposed in the display panel.

In one embodiment, the thin-film transistor layer 30 may include a plurality of first thin-film transistors 31. Each first thin-film transistor 31 may include a first electrode 31a electrically connected to the first power-supply line 21 of the metal wiring layer 20, such that the first thin-film transistor 31 can be supplied with a required power voltage signal through the first power-supply line 21. The power voltage signal may be a constant voltage signal. The film-layer structure of the first thin-film transistor 31 may have different forms depending on actual needs. In one embodiment, a film-layer structure shown in FIG. 1 is provided as an example for illustrating the structure of the first thin-film transistor 31. In addition to the first electrode 31a, each first thin-film transistor 31 may also include a second electrode 31b, a semiconductor layer 31c, and a gate electrode 31g. The first electrode 31a and the second electrode 31b may both electrically connected to the semiconductor layer 31c, such that the first thin-film transistor 31 may be able to demonstrate desired switching characteristics. According to the type of the first thin-film transistor 31 and the signal of the gate electrode 31g, the first electrode 31a may serve as a source electrode and the second electrode 31b may serve as a drain electrode, or alternatively, the first electrode 31a may serve as a drain electrode and the second electrode 31b may serve as a source electrode. At the same time, the thin-film transistor layer 30 may include not only the plurality of first thin-film transistors 31 that is electrically connected to the first power-supply line 21, but also other thin-film transistors. For example, the thin-film transistor layer 30 may also include a plurality of thin-film transistors for receiving data signals from a plurality of data lines. Although the thin-film transistor layer 30 may include various types of thin-film transistors, for illustrative purposes, FIG. 1 only schematically shows the plurality of first thin-film transistors 31 of the thin-film transistor layer 30.

In one embodiment, the thin-film transistor layer 30 may be located on the side of the metal wiring layer 20 that is away from the first flexible substrate 10. That is, the metal wiring layer 20 may be located between the thin-film transistor layer 31 and the first flexible substrate 10. At this time, the at least one first power-supply line 21 and the plurality of first thin-film transistors 31 may be disposed in different layers. The at least one first power-supply line 21 may occupy a sufficient space in the metal wiring layer 20, and thus may be able to effectively prevent the coupling effect between different first power-supply lines 21 or between the first power-supply line 21 and other lines. In addition, the impedance of the first power-supply line 21 can also be set small, which is conducive to reducing the voltage difference in the plurality of first thin-film transistors 31 and improving the uniformity of picture display. Moreover, the first electrode 31a of each first thin-film transistor 31 may be directly or indirectly connected to the at least one first power-supply line 21 by properly setting the number, shape, and arrangement manner, etc. of the at least one first power-supply line 21. The detailed arrangement of the at least one first power-supply line 21 is not limited to the embodiments of the present disclosure. As an example, the first electrode 31a of the first thin-film transistor 31 shown in FIG. 1 is directly connected to a first power-supply line 21.

In one embodiment, a binding region B may be disposed on the side of the first flexible substrate 10 that is away from the metal wiring layer 20. The binding region B may be mainly used to connect external lines to the display panel, such that electrical signals can be provided to the corresponding lines in the display panel, and thus the display panel can display pictures normally. In one embodiment, the binding region B is located on the side of the first flexible substrate 10 that is away from the metal wiring layer 20. In addition, the side of the first flexible substrate 10 away from the metal wiring layer 20 serves as a back side of the display panel and is usually not used for picture display. Accordingly, a front side of the display panel that is opposite to the back side may be used as the light-emitting surface for picture display. Therefore, the binding region B and the region for picture display (e.g., the display region) can be disposed in opposite to each other. Compared to splicing display panels with the binding region and the display region arranged on a same side of the base substrate according to the existing technology, splicing display panels according to various embodiments of the present disclosure may effectively prevent the formation of a wide splicing seam between two adjacent display panels due to the presence of the binding region B, such that when the display panel formed after splicing is used to display pictures, the pictures displayed may overall have desired continuity. Therefore, the disclosed display panel may effectively improve the visual effect of the spliced screen, improve the quality of picture display, and may also make the borderless design of the spliced screen easier to be realized.

In one embodiment, the display panel may include one binding region B. In some other embodiments, the display panel may include more than one binding region B. That is, multiple binding regions B may be disposed in the display panel. For illustrative purposes, as an example shown in FIG. 1 and FIG. 2, the display panel is described to include one binding region B. In the following, the spliced screen will be described in detail in conjunction with other film layers of the display panel.

The plurality of conductive sections 41 of the first conductive layer 40 may be located in the binding region B, and the at least one first power-supply line 21 may be electrically connected to the plurality of conductive sections 41, such that the voltage signals of the external lines can be transmitted to the first power-supply line 21 through the plurality of conductive sections 41. As such, the transmission of electrical signals between the first power-supply line 21 and the external lines can be realized. The first power-supply line 21 may be electrically connected to one or more conductive sections 41 according to actual needs. The external lines may include at least one of a driving chip, a flexible circuit board, and other appropriate electrical circuits.

The disclosed display panel may have at least the following exemplary technical effects.

The power-supply line for the first thin-film transistor in the thin-film transistor layer is disposed base on a metal wiring layer. The metal wiring layer is located between the thin-film transistor layer and the first flexible substrate, such that the first power-supply line is able to occupy a sufficient space in the metal wiring layer and thus is less affected by factors such as line arrangement, etc., which may be conducive to reducing the voltage difference in the plurality of first thin-film transistors and improving the uniformity of picture display of the display panel. In addition, the first power-supply line of the metal wiring layer is electrically connected to the plurality of conductive sections located in a binding region. As such, electrical signals can be transmitted between the first power-supply line and the external lines through the plurality of conductive sections, which ensures that the display panel display pictures normally. Moreover, the binding region is disposed on the side of the first flexible substrate that is away from the metal wiring layer, e.g., the region of the display panel used for picture display and the binding region may be disposed in opposite to each other. Therefore, when splicing multiple display panels together, the width of the splicing seam between two adjacent display panels can be small, which is conducive to ensuring the continuity of the picture display and improving the visual effect.

Referring to FIG. 1, in one embodiment, the display panel may further include a buffer layer 11. The buffer layer 11 may be located between the first flexible substrate 10 and the metal wiring layer 20.

In one embodiment, disposing a buffer layer 11 between the first flexible substrate 10 and the metal wiring layer 20 may be conducive to increasing the adhesion between the first flexible substrate 10 and the metal wiring layer 20, and thus the risk of the metal wiring layer 20 falling off from the first flexible substrate 10 during the bending process of the display panel may be reduced or even eliminated. Moreover, the buffer layer 11 disposed between the first flexible substrate 10 and the metal wiring layer 20 may be able to effectively block the high temperature when forming the metal wiring layer 20, thereby providing desired protection for the first flexible substrate 10.

The material for forming the buffer layer 11 may have various options. For example, the buffer layer 11 may be made of one or more of silicon oxide, silicon nitride, and other appropriate materials. The material used for forming the buffer layer 11 is only required to ensure that the buffer layer 11 can have the effects described above, and the embodiments of the present disclosure are not intended to limit the material of the buffer layer 11.

Figure 3:
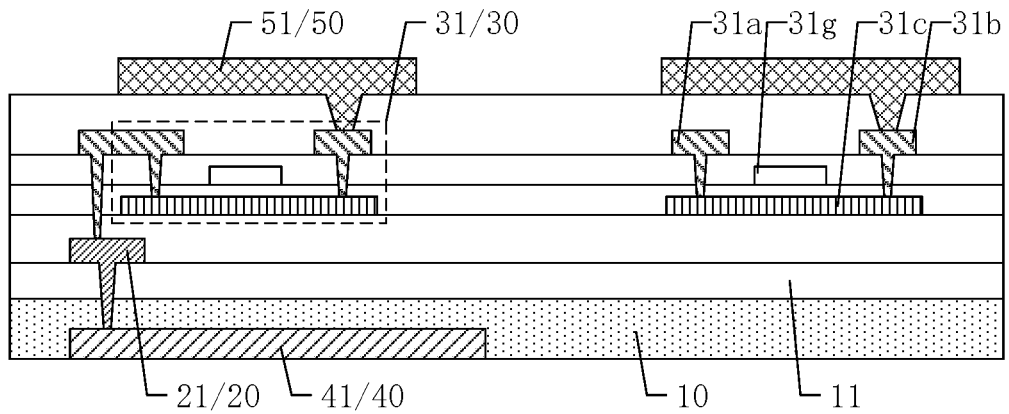
FIG. 3 illustrates a schematic view of another exemplary display panel according to various embodiments of the present disclosure.

FIG. 3 illustrates a schematic view of another exemplary display panel according to various embodiments of the present disclosure. Referring to FIG. 3, in one embodiment, the display panel may further include a light-emitting layer 50. The light-emitting layer 50 may be located on the side of the thin-film transistor layer 30 that is away from the metal wiring layer 20. The light-emitting layer 50 may include a plurality of light-emitting devices 51. Each light-emitting device may be coupled to the second electrode 31b of a corresponding first thin-film transistor 31.

In one embodiment, the plurality of light-emitting devices 51 of the light-emitting layer 50 may be disposed on the side of the thin-film transistor layer 30 that is away from the metal wiring layer 20. FIG. 3 schematically illustrates the electrical connection between a light-emitting device 51 and the second electrode 31b of a corresponding first thin-film transistor 31. Therefore, whether the light-emitting device 51 emits light or not may be controlled by turning the corresponding first thin-film transistor 31 on or off. As such, the display panel may be able to display pictures. The number of the light-emitting devices 51 in each pixel unit may be determined according to actual needs. For example, the light emitted from each pixel unit may be mixed by blue light, green light, and red light, and accordingly, the pixel unit may be disposed with three sub-pixels, and the light-emitting devices 51 in the three sub-pixels may emit blue light, green light, and red light, respectively. However, the number of the light-emitting devices 51 included in each pixel unit and the color of light emitted from each light-emitting device 51 are not limited to the embodiments provided above.

In one embodiment, the light-emitting device 51 may be an inorganic light-emitting diode (LED) or an organic light-emitting diode (OLED). In some other embodiments, the light-emitting device may be any appropriate devices capable of emitting light. In one embodiment, the light-emitting devices 51 may have a stacking structure of film layers directly formed based on the film structure of the thin-film transistor layer 30. Alternatively, the light-emitting devices 51 may be separately fabricated and then transported to the display panel. The detail fabrication of the plurality of light-emitting devices 51 is not limited to the embodiments provided above.

For illustrative purposes, in one embodiment, a Micro LED is taken as an example for the light-emitting device 51. Because the size of the Micro LED is much smaller than the size of an ordinary inorganic light-emitting diode, e.g., the size of the Micro LED can be about 1% of the size of the ordinary inorganic light-emitting diode, the method of transporting the fabricated Micro LED to the display panel may be able to effectively reduce the difficulty of the manufacturing process and shorten the process cycle.

Further, the light-emitting device 51 may be electrically connected to the second electrode 31b of the corresponding first thin-film transistor 31 in a direct manner as shown in FIG. 3. Alternatively, the light-emitting device 51 may be electrically connected to the second electrode 31b of the corresponding first thin-film transistor 31 indirectly through other film-layer structure or through other thin-film transistor. As an example, FIG. 3 illustrates a direct connection between each light-emitting device 51 and the second electrode 31b of the corresponding first thin-film transistor. However, the manner of the connection is not limited to the embodiments provided above. Also, in order to more intuitively illustrate the technical scheme according to the embodiments of the present disclosure, other film-layer structures are not shown in FIG. 3.

Figure 4:
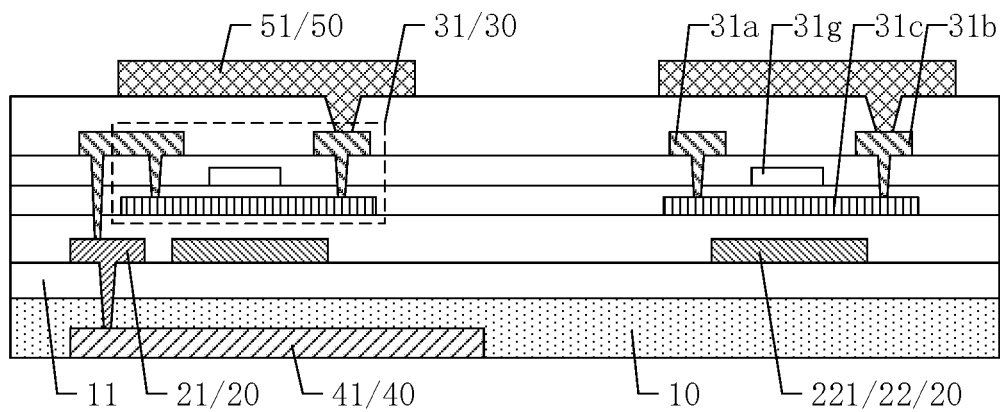
FIG. 4 illustrates a schematic view of another exemplary display panel according to various embodiments of the present disclosure.

FIG. 4 illustrates a schematic view of another exemplary display panel according to various embodiments of the present disclosure. Referring to FIG. 4, in one embodiment, the metal wiring layer 20 may also include a first blocking section 22. The first blocking section 22 may include a plurality of first sub-sections 221. In the direction perpendicular to the plane of the first flexible substrate 10, the orthogonal projection of the semiconductor layer 31c of the first thin-film transistor 31 may at least partially overlap with the orthogonal projection of the plurality of first sub-sections 221.

For example, the semiconductor layer 31 of the first thin-film transistor 31 is usually made of a metal oxide or a silicon material. The meal oxide may include a metal oxide semiconductor formed from one or more of metal elements such as indium and gallium, and the silicon material may be amorphous silicon or polycrystalline silicon. In one embodiment, the orthogonal projection of the plurality of first sub-sections 221 in the direction perpendicular to the plane of the first flexible substrate 10 may at least partially overlap with the orthogonal projection of the semiconductor layer 31c. Therefore, due to the effective protection of the plurality of first sub-sections 221, the semiconductor layer 31c may not be affected by external light, and thus the electrical performance of the first thin-film transistor 31 may be ensured. The dimensional relationship between the plurality of first sub-sections 221 and the semiconductor layer 31c may be determined according to actual conditions, and is not limited to the embodiments of the present disclosure. Similarly, a plurality of first sub-sections 221 corresponding to other thin-film transistors in the thin-film transistor layer 30 may also be provided.

In one embodiment, the metal material used in the first blocking section 22 may be the same as the metal material used in the first power-supply line 21, and accordingly, the first power-supply line 21 and the plurality of first sub-sections 221 of the first blocking section 22 may be patterned simultaneously. In other embodiments, the metal material used in the first blocking section 22 may be different from the metal material used in the first power-supply line 21. Moreover, the metal material used in the first blocking section 22 may include but is not limited to molybdenum, aluminum, and copper.

Figure 5:
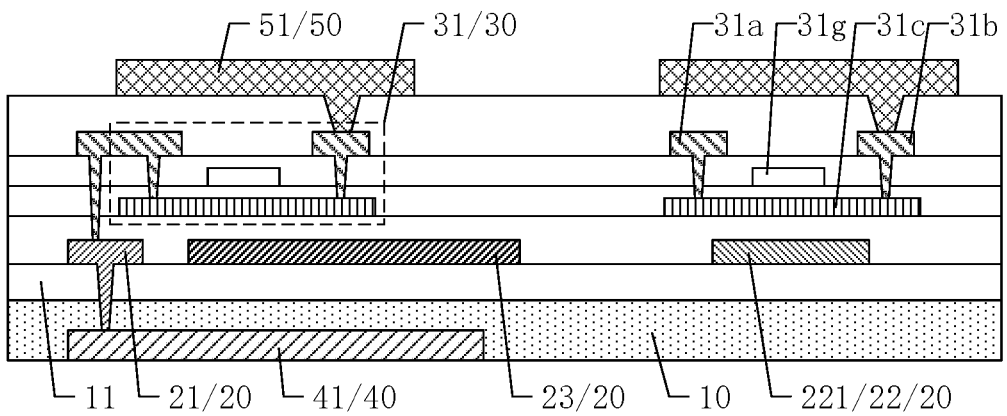
FIG. 5 illustrates a schematic view of another exemplary display panel according to various embodiments of the present disclosure.

FIG. 5 illustrates a schematic view of another exemplary display panel according to various embodiments of the present disclosure. Referring to FIG. 5, in one embodiment, the metal wiring layer 20 may also include a second blocking section 23. In the direction perpendicular to the plane of the first flexible substrate 10, the orthogonal projection of the second blocking section 23 may at least partially overlap with the orthogonal projection of the plurality of conductive sections 41.

In one embodiment, the orthogonal projection of the second blocking section 23 in the direction perpendicular to the plane of the first flexible substrate 10 may at least partially overlap with the orthogonal projection of the plurality of conductive sections 41. Therefore, when binding the plurality of conductive sections 41 to the external lines, the second blocking section 23 may be able to effectively prevent the external lines from interfering the signals of devices in the display panel such as the plurality of first thin-film transistors 31, etc., and thus may ensure that the display panel can display picture normally.

In one embodiment, the orthogonal projection of the second blocking section 23 in the direction perpendicular to the plane of the first flexible substrate 10 may at least partially overlap with the orthogonal projection of the semiconductor layer 31c of the first thin-film transistor 31. Further, when the overlapped region is sufficiently large, it may not be necessary to additionally provide the plurality of first sub-sections 221 corresponding to the semiconductor layer 31c. In some other embodiments, the orthogonal projection of the second blocking section 23 in the direction perpendicular to the plane of the first flexible substrate 10 may not overlap with the orthogonal projection of the semiconductor layer 31c of the first thin-film transistor 31, such that the arrangement of the plurality of conductive sections 41 in the first conductive layer 40 may be more flexible.

The metal material used in the second blocking section 23 may be the same as the metal material used in the first blocking section 22, and accordingly, the second blocking section 23 may be patterned simultaneously with the first blocking section 22 and the plurality of first sub-sections 221. In some other embodiments, the metal material used in the second blocking section 23 may be different from the metal material used in the first blocking section 22. In addition, the dimensional relationship between the second blocking section 23 and the conductive section 41 may be determined according to actual conditions, and is not limited to the embodiments of the present disclosure.

Figure 6:
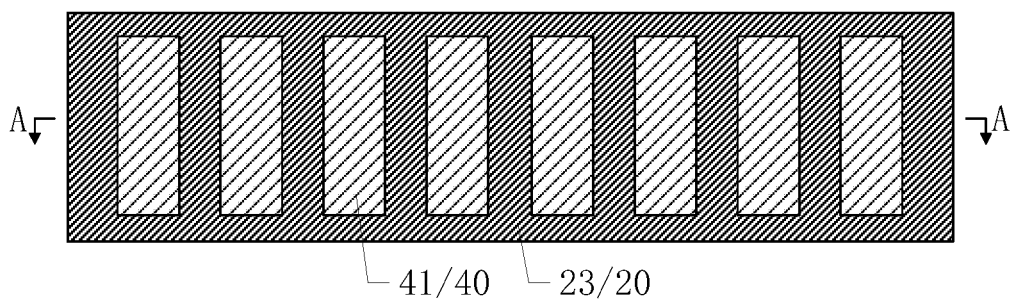
FIG. 6 illustrates a schematic diagram of a structure arrangement for a second blocking section and a plurality of conductive sections according to various embodiments of the present disclosure.
Figure 7:
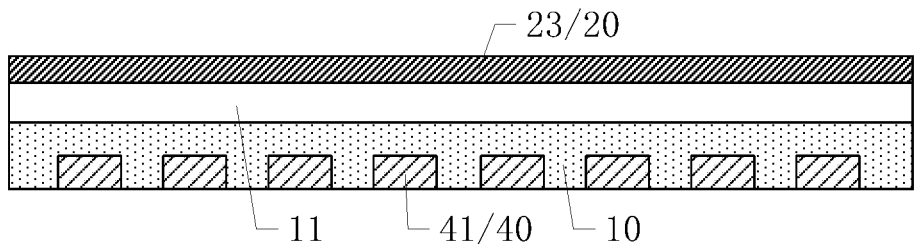
FIG. 7 illustrates a schematic cross-sectional view of the structure arrangement shown in FIG. 6 along an A-A direction.

FIG. 6 illustrates a schematic diagram of a structure arrangement for a second blocking section and a plurality of conductive sections according to various embodiments of the present disclosure, and FIG. 7 illustrates a schematic cross-sectional view of the structure arrangement shown in FIG. 6 along an A-A direction. Referring to FIGS. 5-7, in one embodiment, the second blocking section 23 may have a planar structure, and in the direction perpendicular to the plane of the first flexible substrate 10, the orthogonal projection of the second blocking section 23 may overlap with the orthogonal projection of the plurality of conductive sections 41, which may be conducive to reducing the difficulty of the manufacturing process. In addition, the second blocking section 23 may also be able to effectively prevent the external lines from interfering the signals of devices in the display panel such as the plurality of first thin-film transistors 31, etc., and thus may ensure that the display panel can display picture normally.

The shape of the planar structure of the second blocking section 23 may have different forms, such as a rectangular shape, an elliptic shape, a circular shape, etc. In addition, the second blocking section 23 should be disposed away from the at least one first power-supply line 21 to prevent the second blocking section 23 from affecting the voltage signals of the at least one first power-supply line 21. In addition, in order to prevent the second blocking section 23 from affecting the normal picture display of the display panel due to the generation of static electricity, it may be necessary to perform an antistatic treatment on the second blocking section 23. For example, the second blocking section 23 may be grounded.

Figure 8:
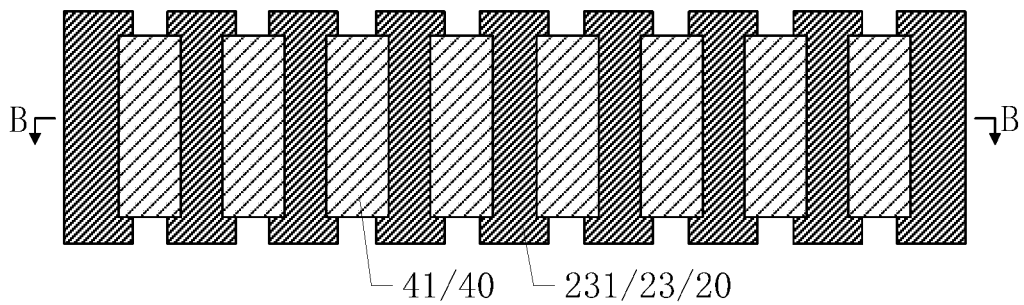
FIG. 8 illustrates another schematic diagram of a structure arrangement for a second blocking section and a plurality of conductive sections according to various embodiments of the present disclosure.
Figure 9:
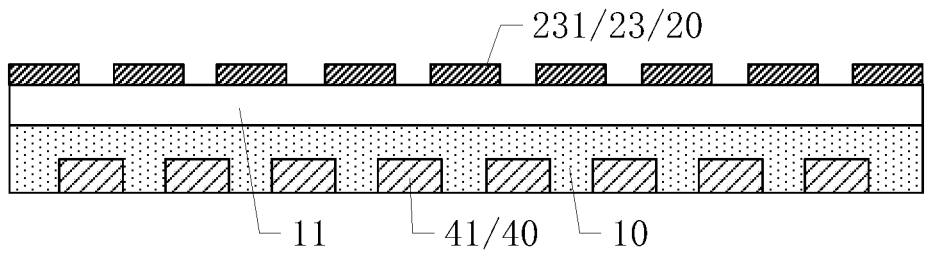
FIG. 9 illustrates a schematic cross-sectional view of the structure arrangement shown in FIG. 8 along a B-B direction.

FIG. 8 illustrates another schematic diagram of a structure arrangement for a second blocking section and a plurality of conductive sections according to various embodiments of the present disclosure, and FIG. 9 illustrates a schematic cross-sectional view of the structure arrangement shown in FIG. 8 along a B-B direction. Referring to FIGS. 5, and 8-9, the second blocking section 23 may include a plurality of second sub-sections 231. In the direction perpendicular to the plane of the first flexible substrate 10, the plurality of second sub-sections 231 and the plurality of conductive sections 41 may be alternately disposed.

In one embodiment, by arranging the second blocking section 23 as a plurality of second sub-sections 231, a certain gap between the plurality of second sub-sections 231 can be ensured, which may efficiently prevent static charges from being transmitted between the plurality of second sub-sections 231, and thus may improve the antistatic ability of the second blocking section 23. In addition, by alternately disposing the plurality of second sub-sections 231 and the plurality of conductive sections 41 in the direction perpendicular to the plane of the first flexible substrate 10, the total area of the orthogonal projection of the plurality of second sub-sections 231 and the plurality of conductive sections 41 on the first flexible substrate 10 may be effectively increased. Therefore, when the external lines are bound to the binding region B through a process such as laser irradiation, the plurality of second sub-sections 231 and the plurality of conductive portions 41 that are alternately disposed may not only effectively prevent the semiconductor layer 31c from being affected by external light, e.g. laser light, but also effectively prevent the external lines from interfering the signals of devices in the display panel such as the plurality of first thin-film transistors 31, etc., and thus may ensure that the display panel can display picture normally.

The dimensions of the plurality of second sub-sections 231 and the plurality of conductive sections 41 may be set according to actual needs, and in order to obtain the desired effect described above, the gap between the plurality of second sub-sections 231 may be set small, or the gap may be set to have an orthogonal projection in the direction perpendicular to the plane of the first flexible substrate 10 overlapping with the orthogonal projection of the semiconductor layer 31c as much as possible. The dimensions of the plurality of second sub-sections 231 and the plurality of conductive sections 41 are not limited to the embodiments of the present disclosure.

Figure 10:
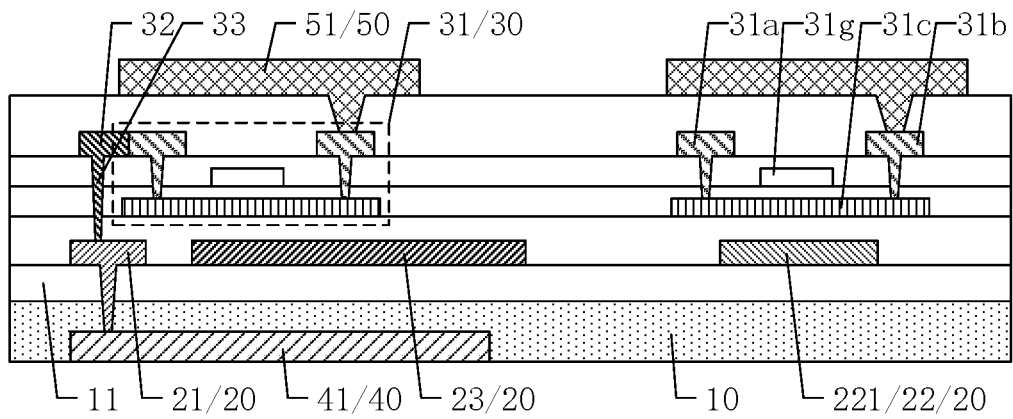
FIG. 10 illustrates a schematic view of another exemplary display panel according to various embodiments of the present disclosure.

FIG. 10 illustrates a schematic view of another exemplary display panel according to various embodiments of the present disclosure. Referring to FIG. 10, in one embodiment, the display panel may also include a plurality of second power-supply lines 32. The plurality of second power-supply lines 32 and the first electrode 31a of each first thin-film transistor 31 may be disposed in a same layer. The first electrode 31a of each first thin-film transistor 31 may be electrically connected to a corresponding second power-supply line 32, and the second power-supply line 32 may be electrically connected to a first power-supply line 21 through at least one through hole 33.

In one embodiment, the plurality of second power-supply lines 32 and the first electrodes 31a of the plurality of first thin-film transistors 31 may be disposed in a same layer, that is, the plurality of second power-supply lines 32 and the first electrodes 31a of the plurality of first thin-film transistors 31 may be patterned from a same material. As such, the difficulty of the manufacturing process may be reduced, and the production efficiency of the display panel may be improved. In some other embodiments, in order to reduce the impedance of the second power-supply line 32, the plurality of second power-supply lines 32 may be patterned from a material that has smaller impedance compared to the material used for the first electrode 31a.

Each second power-supply line 32 may be electrically connected to a first power-supply line 31, such that the voltage signals of the first power-supply line 21 may be transmitted to the second power-supply line 32 through the at least one through hole 33. To reduce the voltage difference in the plurality of first thin-film transistors 31, the impedance relationship between the material used for the first power-supply line 21 and the material used for the second power-supply line 32 and the number of the through holes 33 may be determined according to actual needs. As such, when the display panel displays pictures, the uniformity of picture display may be desired.

Referring to FIG. 10, in one embodiment, the width of the first power-supply line 21 may be larger than the width of the second power-supply line 32.

Because the line arrangement of the plurality of second power-supply lines 32 in the film layer is dense, in order to prevent the coupling effects between the lines, the second power-supply line 32 can only be set thin, that is, the width of the second power-supply line 32 has to be small. However, the impedance of the second power-supply line 32 may be made large. By electrically connecting the second power-supply line 32 and the first power-supply line 21, the difference in the voltages transmitted to the plurality of first thin-film transistors 31 may be reduced. At this time, in order to further reduce the voltage difference, the number of the through holes 33 may be increase to further improve the uniformity of picture display of the display panel.

In one embodiment, the material used for the plurality of first power-supply lines 21 may be the same as the material used for the plurality of second power-supply lines 32. In other embodiments, the material used for the plurality of first power-supply lines may be different from the material used for the plurality of second power-supply lines.

Figure 11:
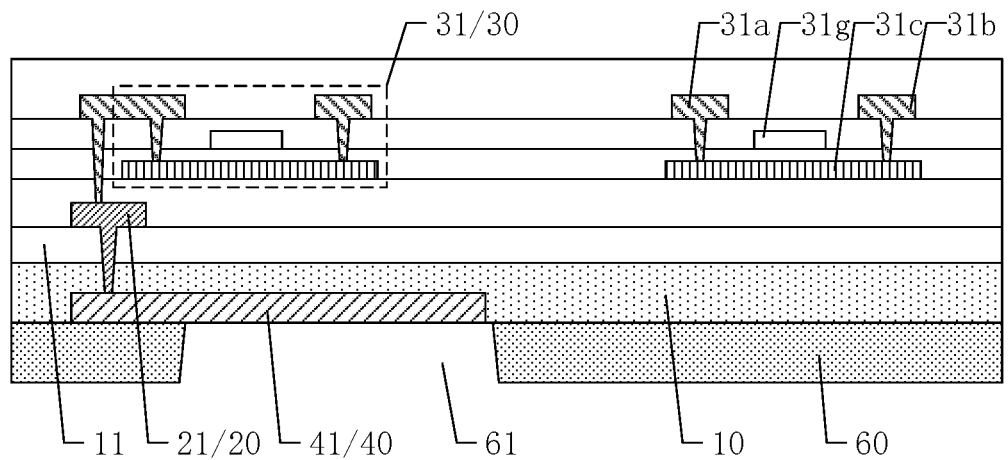
FIG. 11 illustrates a schematic view of another exemplary display panel according to various embodiments of the present disclosure.

FIG. 11 illustrates a schematic view of another exemplary display panel according to various embodiments of the present disclosure. Referring to FIG. 11, in one embodiment, the display panel may further include a second flexible substrate 60. The second flexible substrate 60 may be located on the side of the first flexible substrate 10 that is away from the metal wiring layer 20. The second flexible substrate 60 may include a plurality of trenches 61, and the plurality of trenches 61 may expose at least a portion of each conductive section 41.

In one embodiment, a second flexible substrate 60 may be disposed on the side of the first flexible substrate 10 that is away from the metal wiring layer 20, such that desired protection may be provided for the first flexible substrate 10 and the first conductive layer 40 through the second flexible substrate 60, which may be conducive to improving the stability of the performance of the display panel. The plurality of trenches 61 formed in the second flexible substrate 60 may be mainly used to expose at least a portion of the conductive section 41 according to actual needs, so that external lines can be bound to the display panel through the exposed portion of the conductive section 41. At this time, by properly arranging the dimension of the plurality of trenches 61, the second flexible substrate 60 may also be able to provide desired protection for the electrical connection structure between the external lines and the conductive sections 41, which may be conducive to improving the effectiveness of the electrical connection structure between the conductive sections 41 and the external lines.

In one embodiment, the second flexible substrate 60 and the first flexible substrate 10 may have a same dimension and may be made of a same material. In other embodiments, the second flexible substrate 60 and the first flexible substrate 10 may have different dimensions and/or may be made of different materials.

It should be noted that, in order to more intuitively illustrate the technical scheme according to the embodiments of the present disclosure, other film-layer structures are not shown in any of FIGS. 1-11.

Figure 12:
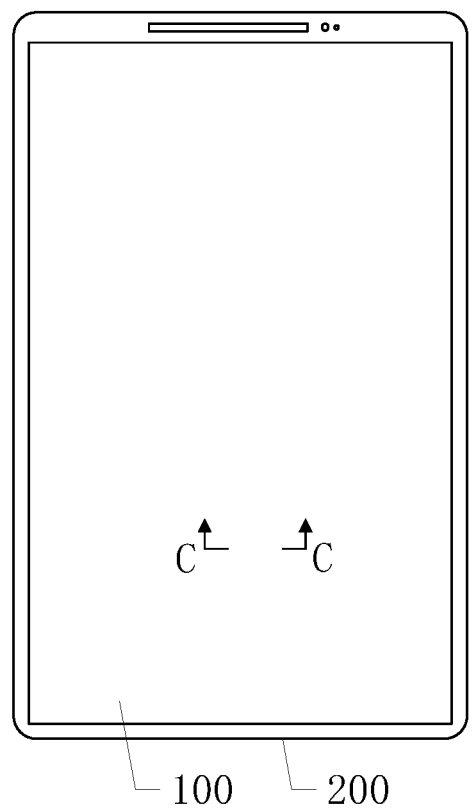
FIG. 12 illustrates a schematic view of an exemplary display device according to various embodiments of the present disclosure.

The present disclosure also provides a display device, and the display device may include a display panel according to various embodiments of the present disclosure. FIG. 12 illustrates a schematic view of an exemplary display device according to various embodiments of the present disclosure.

Referring to FIG. 12, in one embodiment, a display device 200 may include a display panel 100 consistent with various embodiments of the present disclosure. In FIG. 12, a mobile phone is provided as an example to illustrate the display device 200. It should be understood that the display panel according to the embodiments of the present disclosure can be a computer, a television, an in-vehicle display device, or any other device with a display function. The display device according to various embodiments of the present disclosure may have the beneficial effects of the display panel according to the embodiments described above. For the details of the beneficial effects, reference may be made to the detailed description of the display panel in the embodiments described above.

Figure 13:
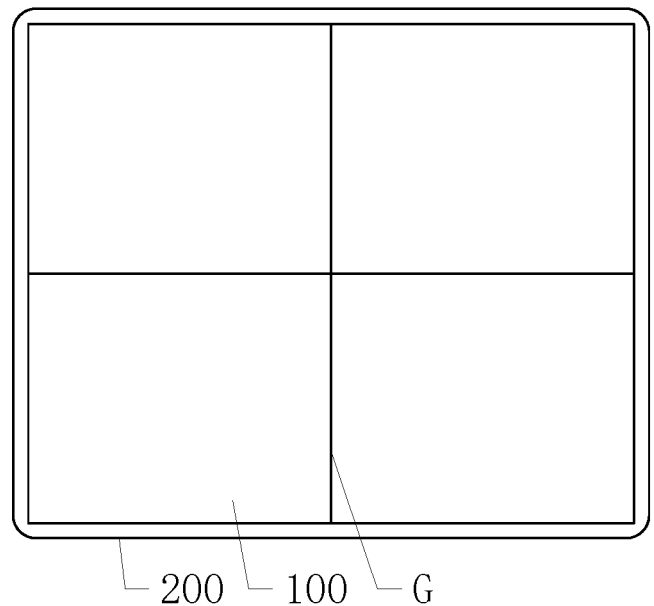
FIG. 13 illustrates a schematic view of another exemplary display device according to various embodiments of the present disclosure.

FIG. 13 illustrates a schematic view of another exemplary display device according to various embodiments of the present disclosure. Referring to FIG. 13, in one embodiment, the display device may be formed by splicing multiple display panels 100 according to various embodiments of the present disclosure. Referring to FIG. 2, in the display panel 100 according to the embodiments described above, the external lines may be bound to the binding region B of the display panel. The binding region B may be located on the back side of the display panel 100. The front side of the display panel 100 that is opposite to the back side may be used for picture display. Therefore, the border of the display panel 100 may be set small, and the width of the splicing seam G between two adjacent display panels 100 may be small. Therefore, when the display device displays pictures, human eyes may not be able to clearly perceive the presence of the splicing seam G, such that the pictures displayed by the display panels 100 may demonstrate desired continuity. As such, the visual effect of the entire display device 200 may be effectively improved, and at the same time, the narrow-border design of the display device 200 may be more easily realized.

The number of the display panels 100 included in the display device 200 may be determined according to the actual needs. In one embodiment, the dimensions of the multiple display panels 100 may be the same. In some other embodiments, the dimensions of the multiple display panels may not be the same. As shown FIG. 13, a display device 200 formed by splicing four display panels 100 together is provided as an example to illustrate the disclosed display device.

Figure 14:
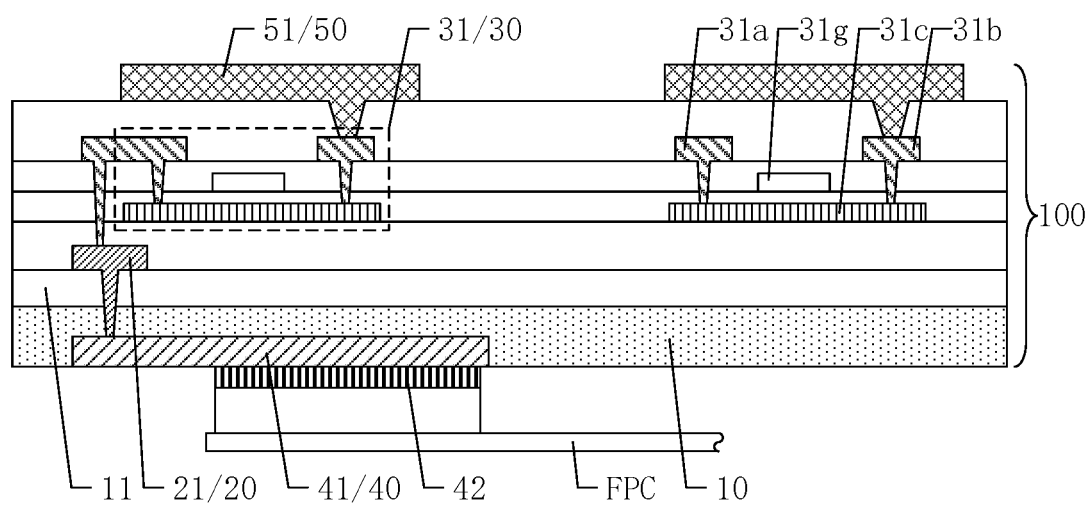
FIG. 14 illustrates a schematic cross-sectional view of the structure shown in FIG. 12 along a C-C direction.
Figure 15:
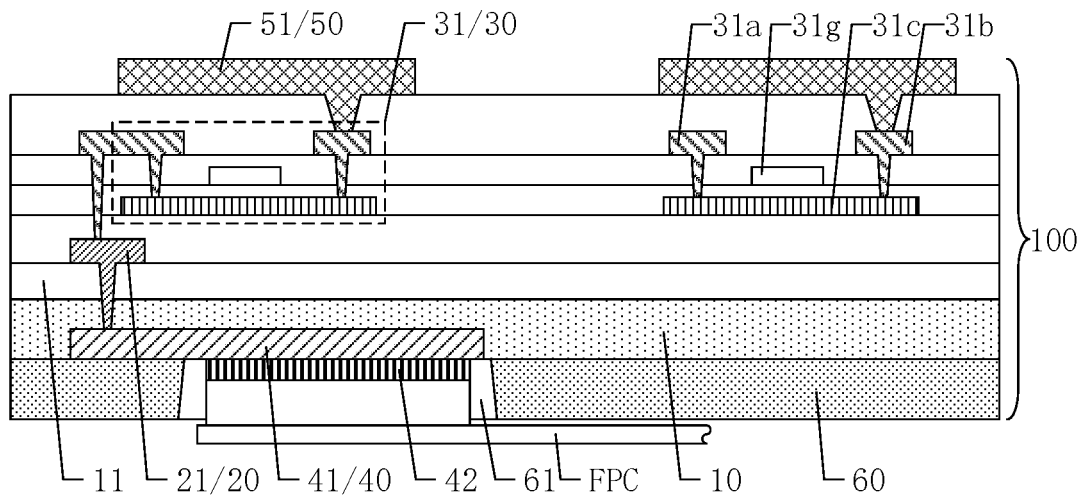
FIG. 15 illustrates another schematic cross-sectional view of the structure shown in FIG. 12 along a C-C direction.

FIG. 14 illustrates a schematic cross-sectional view of the structure shown in FIG. 12 along a C-C direction, and FIG. 15 illustrates another schematic cross-sectional view of the structure shown in FIG. 12 along a C-C direction. Referring to FIGS. 12, and 14-15, in one embodiment, the display device may further include at least one FPC board. The at least one FPC board may include a second conductive layer 42. The second conductive layer 42 may be electrically connected to the plurality of conductive sections 41.

In one embodiment, referring to FIG. 14, the base substrate of the display panel 100 may only include the first flexible substrate 10. Accordingly, the second conductive layer 42 of the FPC board may be electrically connected to the plurality of conductive sections 41 in a direct manner through a hot pressing process or any other appropriate process. As such, the second conductive layer 42 may be able to provide electrical signals to the corresponding lines in the display panel through the plurality of conductive sections 41.

Further, referring to FIG. 15, the base substrate of the display panel 100 may include a first flexible substrate 10 and a second flexible substrate 60. Accordingly, in order to electrically connect the second conductive layer 42 of the FPC board to the plurality of conductive sections 41, the second flexible substrate 60 may need to be provided with one or more trenches 61, such that at least a portion of each conductive section 41 can be exposed. After the second conductive layer 42 is electrically connected to the plurality of conductive sections 41, an insulating glue, such as an ultraviolet (UV) glue, etc. may be filled in the plurality of trenches 61 to provide isolation protection for the electrical connection structure. In the meantime, the second conductive layer 42 may also be properly positioned in the plurality of trenches 61.

Figure 16:
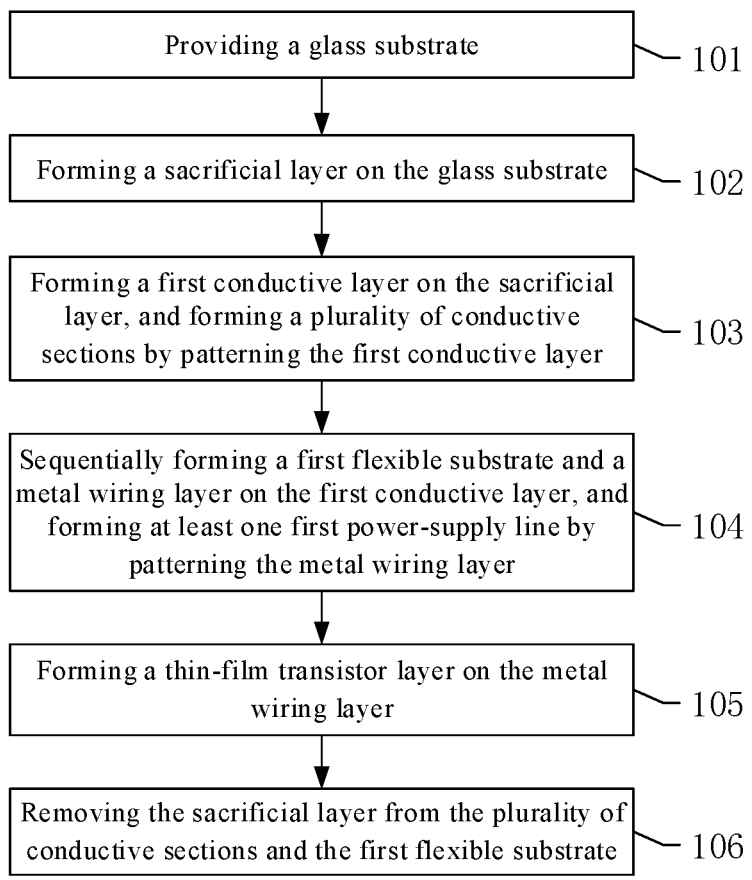
FIG. 16 illustrates a flow chart of an exemplary method for fabricating a display panel according to various embodiments of the present disclosure.

Further, the present disclosure further provides a fabrication method of a display panel. FIG. 16 illustrates a flow chart of an exemplary method for fabricating a display panel according to various embodiments of the present disclosure, and FIGS. 17-21 illustrate schematic cross-sectional views of semiconductor structures at certain stages of the fabrication method illustrated in FIG. 16.

Referring to FIGS. 1-2, and 16-21, the fabrication method may include the following exemplary steps.

In step 101, a glass substrate 70 may be provided.

In step 102, a sacrificial layer 71 may be formed on the glass substrate 71.

In step 103, a first conductive layer 40 may be formed on the sacrificial layer 71, and the first conductive layer 40 may be patterned to form the plurality of conductive sections 41.

In step 104, a first flexible substrate 10 and a metal wiring layer 20 may be sequentially disposed on the first conductive layer 40, and the metal wiring layer 20 may be patterned to form at least one first power-supply line 21. Moreover, a binding region B may be disposed on the side of the first flexible substrate 10 that is away from the metal wiring layer 20, and the plurality of conductive sections 41 may be located in the binding region B. The first power-supply line 21 may be electrically connected to at least one conductive section 41.

In step 105, a thin-film transistor layer 30 may be formed on the metal wiring layer 20. The thin-film transistor layer 30 may include a plurality of first thin-film transistors 31. A first electrode 31a of each first thin-film transistor 31 may be electrically connected to a corresponding first power-supply line 21.

In step 106, the sacrificial layer 71 may be removed from the plurality of conductive sections 41 and the first flexible substrate 10.

For example, the adhesion between the glass substrate 70 and the first flexible substrate 10 may be strong, and in order to remove the glass substrate 70 more easily from the first flexible substrate 10 as described in step 106, a sacrificial layer 71 may need to be formed on the surface of the glass substrate 70 in advance. At this time, in one embodiment, the adhesion between the sacrificial layer 71 and the first flexible substrate 10 may need to be smaller than the adhesion between the glass substrate 70 and the first flexible substrate 10. In some other embodiments, the glass substrate 70 may be replaced by a rigid substrate such as a ceramic substrate, a quartz glass substrate, or any other appropriate substrate.

In one embodiment, the first flexible substrate 10 and the metal wiring layer 20 may be sequentially formed. However, prior to forming the metal wiring layer 20, a buffer layer 11 may be formed on the first flexible substrate 10. Forming the buffer layer 11 may be conducive to improving the adhesion between the first flexible substrate 10 and the metal wiring layer 20, and thus the risk of the metal wiring layer 20 falling off from the first flexible substrate 10 during the bending process of the display panel may be reduced or even eliminated. Moreover, the buffer layer 11 disposed between the first flexible substrate 10 and the metal wiring layer 20 may be able to effectively block the high temperature when forming the metal wiring layer 20, thereby providing desired protection for the first flexible substrate 10. The material used for forming the buffer layer 11 is described in the embodiments provided above, and the details will not be described herein again.

In one embodiment, a thin-film transistor layer 30 may be formed on the metal wiring layer 20, and the first electrode 31a of each first thin-film transistor 31 in the thin-film transistor layer 30 may be electrically connected to the at least one first power-supply line 21. As such, electrical signals required by the first thin-film transistor 31 may be provided through the corresponding first power-supply line 21. The manufacturing process of the plurality of first thin-film transistors 31 may be the same as the manufacturing process of thin-film transistors according to the existing technology, and the details of the manufacturing process may not be described herein again.

In one embodiment, after fabricating the film-layer structures of the display panel, the glass substrate 70 may be removed from the plurality of conductive sections 41 and the first flexible substrate 10 through the sacrificial layer 71. The detailed method for removing the sacrificial layer 71 may be determined according to actual needs.

Further, referring to FIGS. 17-21, in one embodiment, the sacrificial layer 71 may include one of amorphous silicon (a-Si), silicon oxide, silicon nitride, etc. The adhesion between the material of the sacrificial layer 71 and the first flexible substrate 10 may be far weaker than the adhesion between the glass substrate 70 and the first flexible substrate 10, such that the sacrificial layer 71 may be easier to be removed from the first flexible substrate 10, which may be conducive to reducing the difficulty of the removal process, and improving the production efficiency of the display panel. In some other embodiments, the sacrificial layer 71 may be made of a material that has weak adhesion to the first flexible substrate 10.

Further, referring to FIGS. 17-21, in one embodiment, removing the sacrificial layer 71 from the plurality of conductive sections 41 and the first flexible substrate 10 may include performing a laser lift-off process to remove the sacrificial layer 71 from the plurality of conductive sections 41 and the first flexible substrate 10.

In one embodiment, the laser lift-off process may utilize the laser energy to decompose the sacrificial layer 71 between the glass substrate 70 and the first flexible substrate 10. That is, by irradiating the sacrificial layer 71 using laser beams, the sacrificial layer 71 can be removed from the plurality of conductive sections 41 and the first flexible substrate 10. The laser lift-off process is simple and convenient, which may be conducive to further improving the production efficiency of the display panel.

Figure 22:
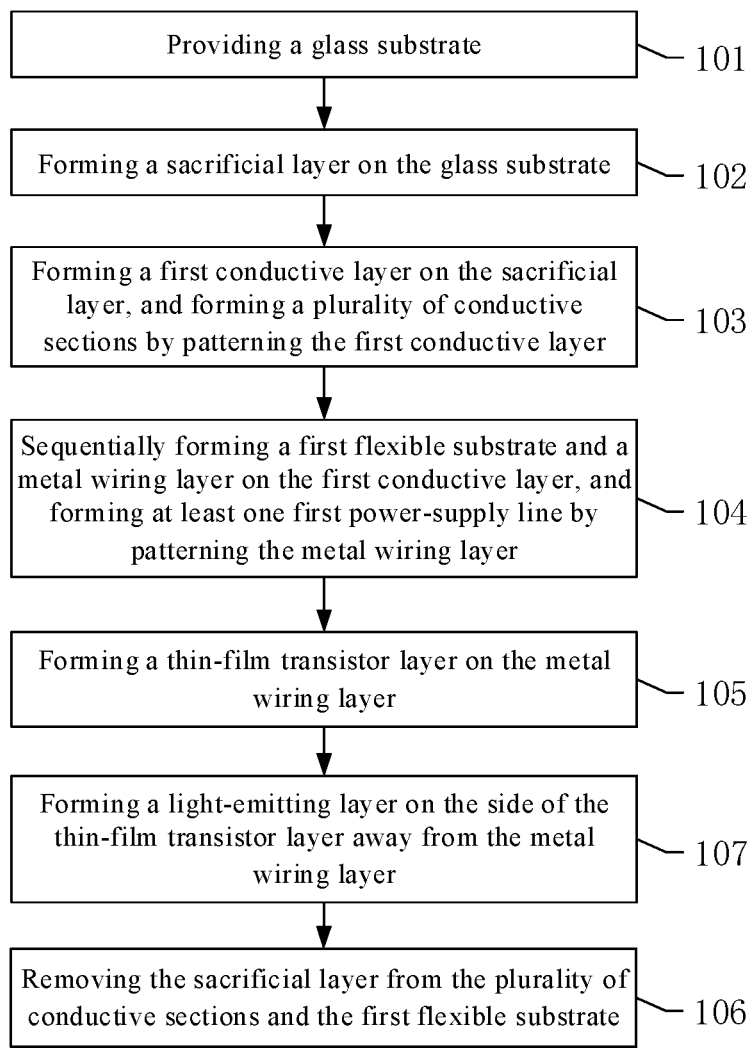
FIG. 22 illustrates a flow chart of another exemplary method for fabricating a display panel according to various embodiments of the present disclosure.
Figure 23:
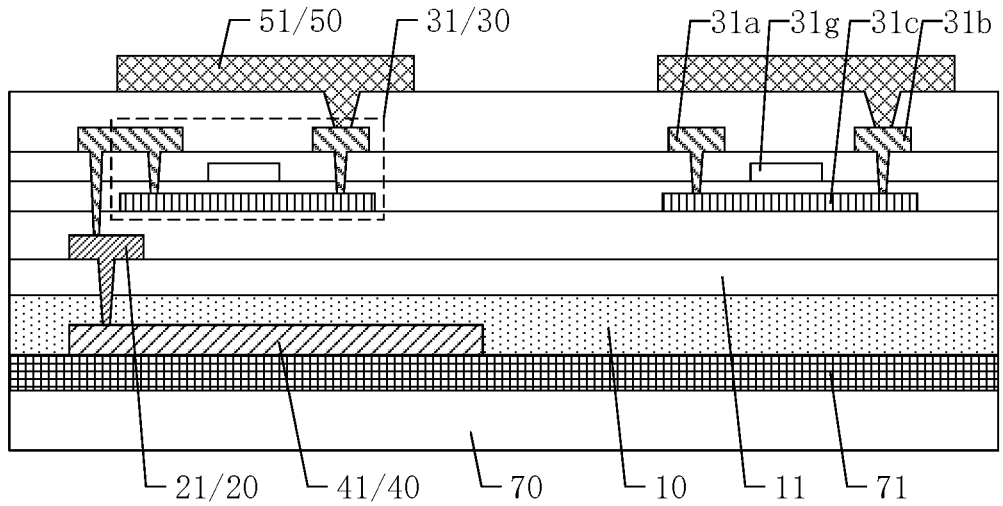
FIG. 23 illustrates a schematic cross-sectional view of a semiconductor structure according to the fabrication method illustrated in FIG. 22.

FIG. 22 illustrates a flow chart of another exemplary method for fabricating a display panel according to various embodiments of the present disclosure, and FIG. 23 illustrates a schematic cross-sectional view of a semiconductor structure according to the fabrication method illustrated in FIG. 22. Referring to FIGS. 3 and 22-23, in one embodiment, after performing step 105 and prior to performing step 106, the fabrication method of the display panel may further include step 107. In step 107, a light-emitting layer 50 may be formed on the side of the thin-film transistor layer 30 that is away from the metal wiring layer 20. The light-emitting layer 50 may include a plurality of light-emitting devices 51. Each light-emitting device 51 may be coupled to the second electrode 31b of a corresponding first thin-film transistor 31.

In one embodiment, disposing the plurality of light-emitting devices 51 on the side of the thin-film transistor layer 30 that is away from the metal wiring layer 20 may be able to effectively prevent the line arrangement on the side of the light-emitting layer 50 that is adjacent to the first flexible substrate 10 from affecting the plurality of light-emitting devices 51. In the meantime, with each light-emitting device 51 coupled to the second electrode 31b of a corresponding thin-film transistor 31, whether the light-emitting device 51 emits light or not may be controlled by turning the first thin-film transistor 31 on or off. As such, the display panel may be able to display pictures normally.

According to actual needs, the light-emitting device 51 may be configured as an inorganic light-emitting diode, an organic light-emitting diode, or any other appropriate device that is capable of emitting light. Therefore, the corresponding process of the light-emitting device 51 can be the same as the process of the devices that have the light-emitting function in the existing technology.

Figure 17:
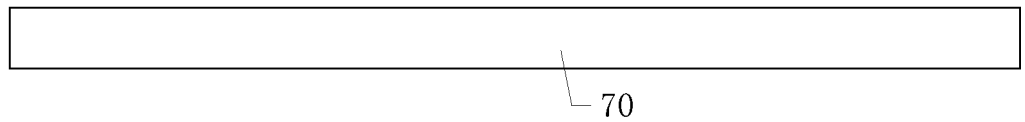
FIGS. 17-21 illustrate schematic cross-sectional views of semiconductor structures at certain stages of the fabrication method illustrated in FIG. 16.
Figure 18:
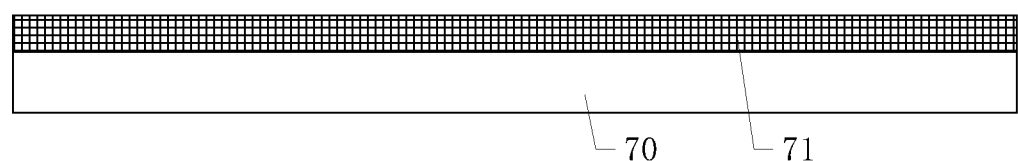
Figure 19:
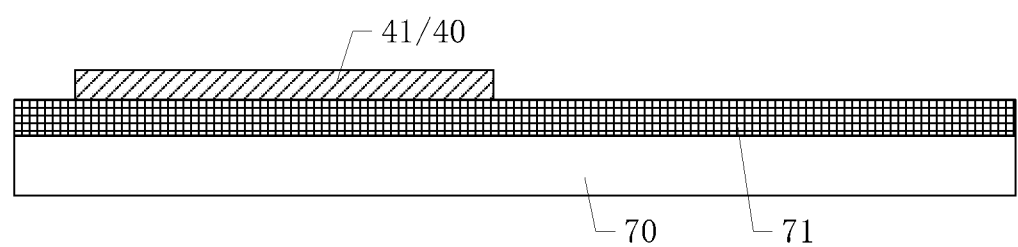
Figure 20:
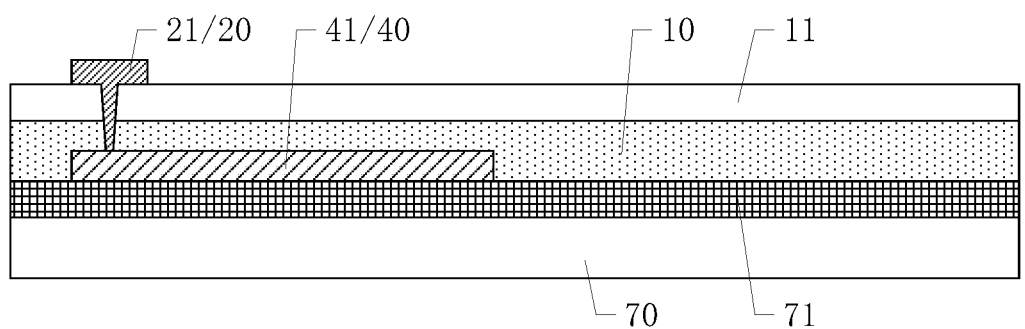
Figure 21:
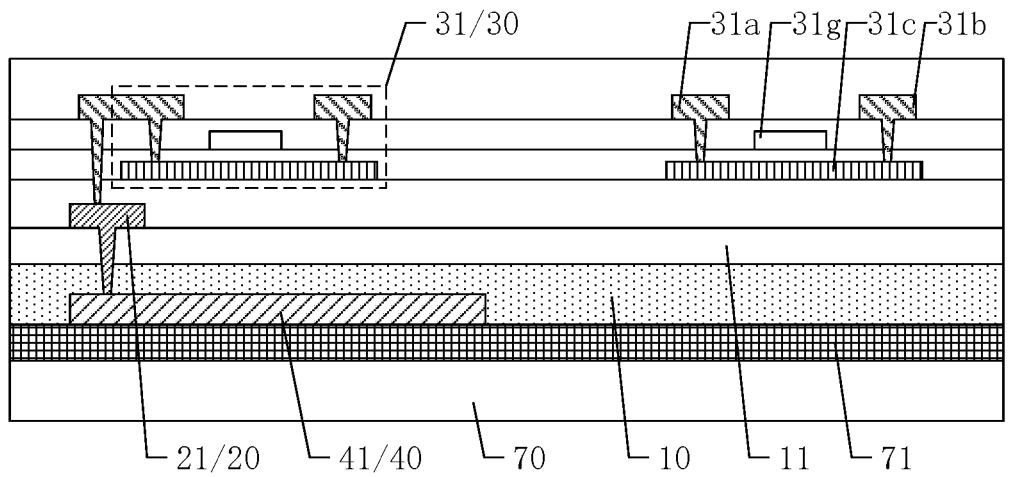
Figure 24:
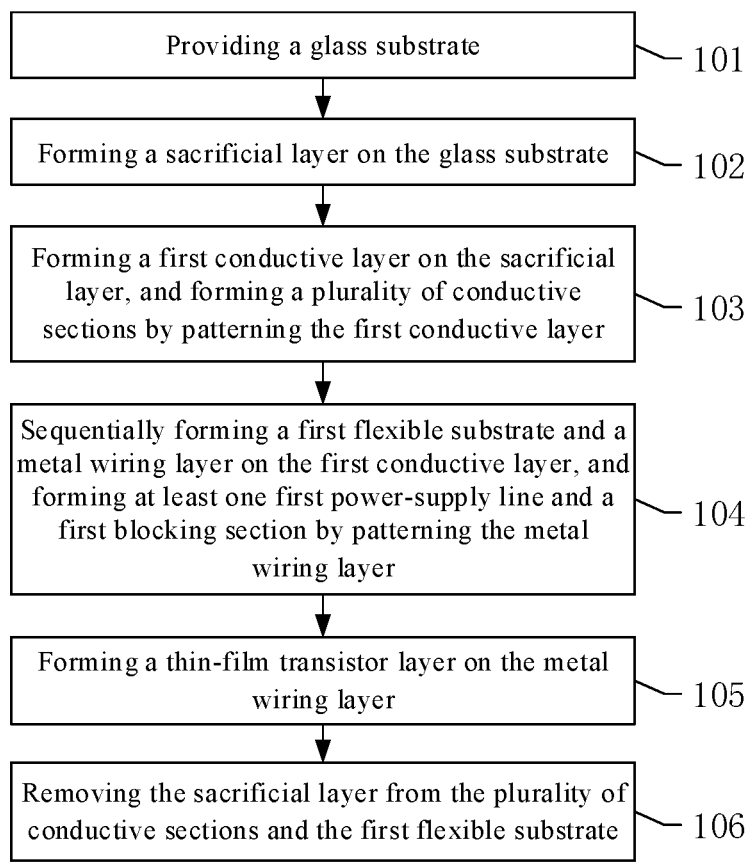
FIG. 24 illustrates a flow chart of another exemplary method for fabricating a display panel according to various embodiments of the present disclosure.
Figure 25:
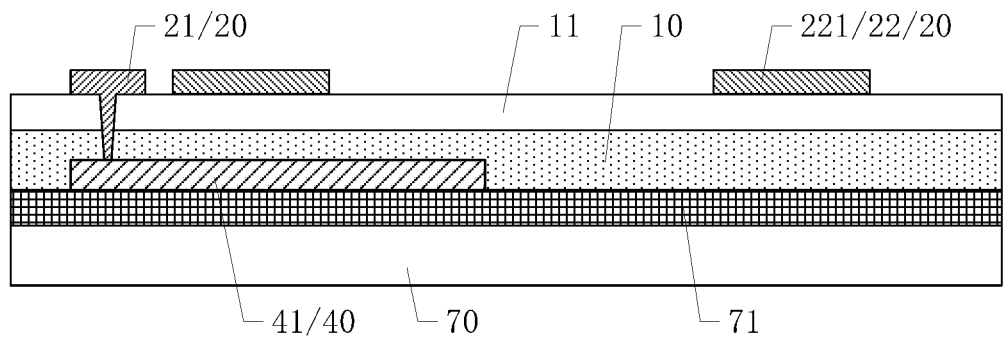
FIGS. 25-27 illustrate schematic cross-sectional views of semiconductor structures at certain stages of the fabrication method illustrated in FIG. 24.
Figure 26:
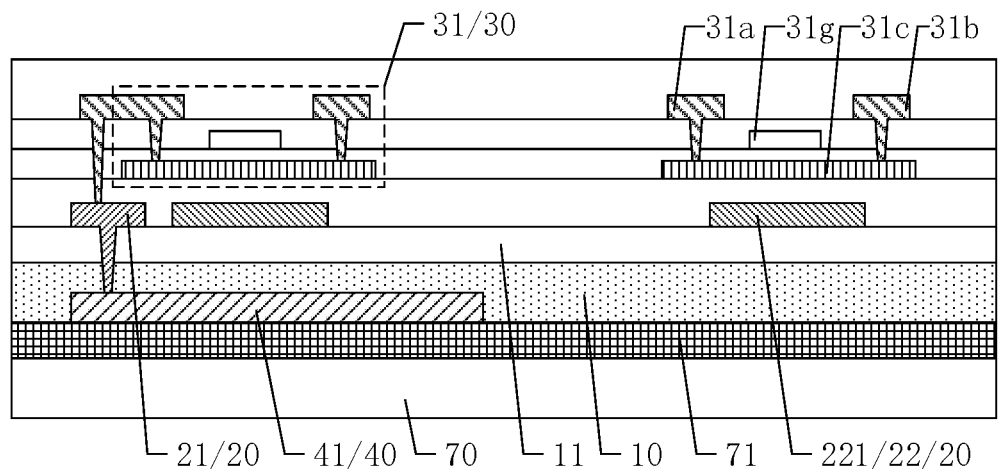
Figure 27:
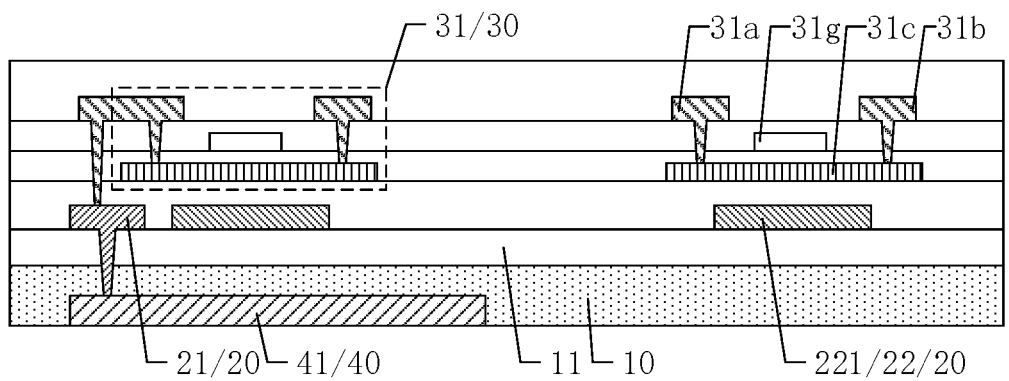

FIG. 24 illustrates a flow chart of another exemplary method for fabricating a display panel according to various embodiments of the present disclosure, and FIGS. 25-27 illustrate schematic cross-sectional views of semiconductor structures at certain stages of the fabrication method illustrated in FIG. 24. Referring to FIGS. 24-17, in one embodiment, in step 104 described above, when patterning the metal wiring layer 20 to form at least one first power-supply line 21, a first blocking section 22 may also be formed. The first blocking section 22 may include a plurality of first sub-sections 221, and in the direction perpendicular to the plane of the first flexible substrate 10, the orthogonal projection of the semiconductor layer 31c of the first thin-film transistor 31 may at least partially overlap with the orthogonal projection of the plurality of first sub-sections 221.

In one embodiment, the at least one power-supply line 21 of the metal wiring layer 20 and the first blocking section 22 are simultaneously formed through patterning, which may be conducive to simplifying the manufacturing process and improving the production efficiency of the display panel. Moreover, because the orthogonal projection of the plurality of first sub-sections 221 in the direction perpendicular to the plane of the first flexible substrate 10 at least partially overlaps with the orthogonal projection of the semiconductor layer 31c, when removing the sacrificial layer 71 from the plurality of conductive sections 41 and the first flexible substrate 10 through, for example, a laser lift-off process, the plurality of first sub-sections 221 may be able to effectively prevent the semiconductor layer 31c from being affected by external light, e.g. laser light, and thus desired electrical performance of the first thin-film transistor 31 can be ensured.

Figure 28:
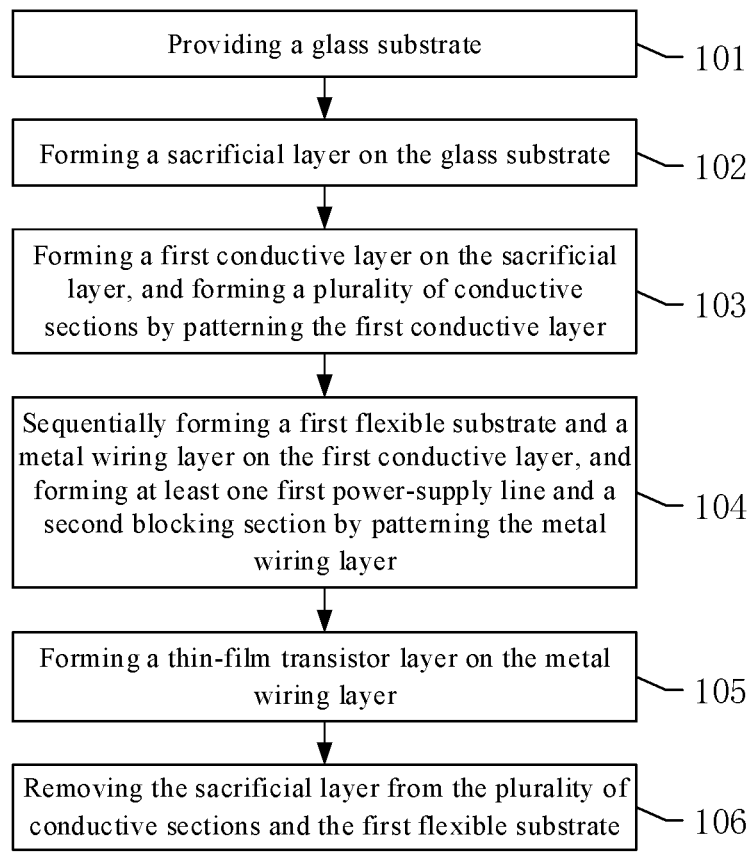
FIG. 28 illustrates a flow chart of another exemplary method for fabricating a display panel according to various embodiments of the present disclosure.
Figure 29:
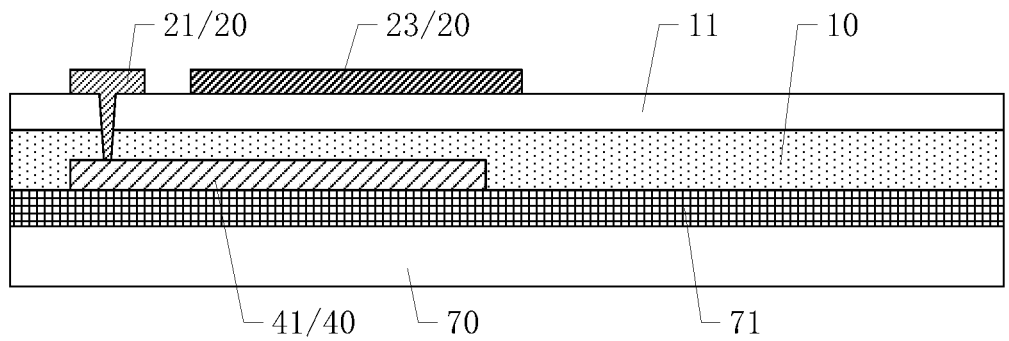
FIGS. 29-31 illustrate schematic cross-sectional views of semiconductor structures at certain stages of the fabrication method illustrated in FIG. 28.
Figure 30:
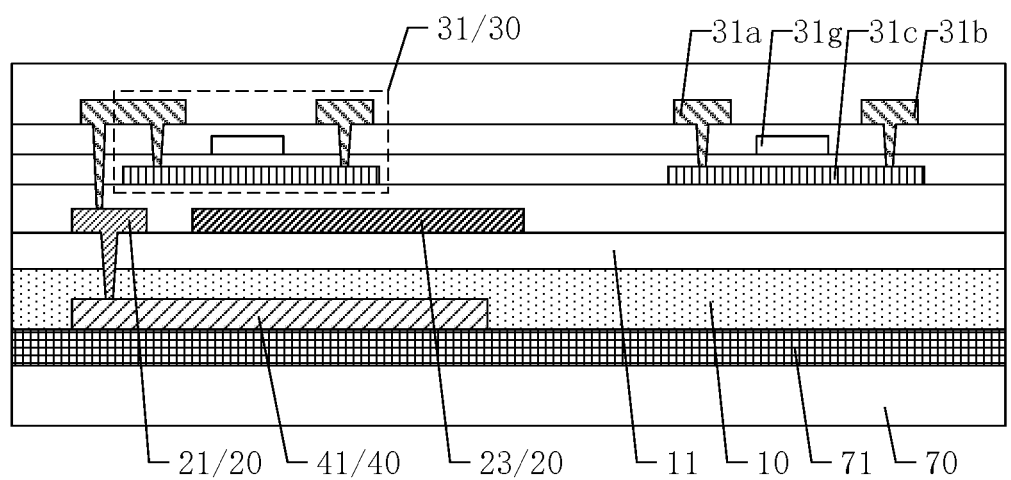
Figure 31:
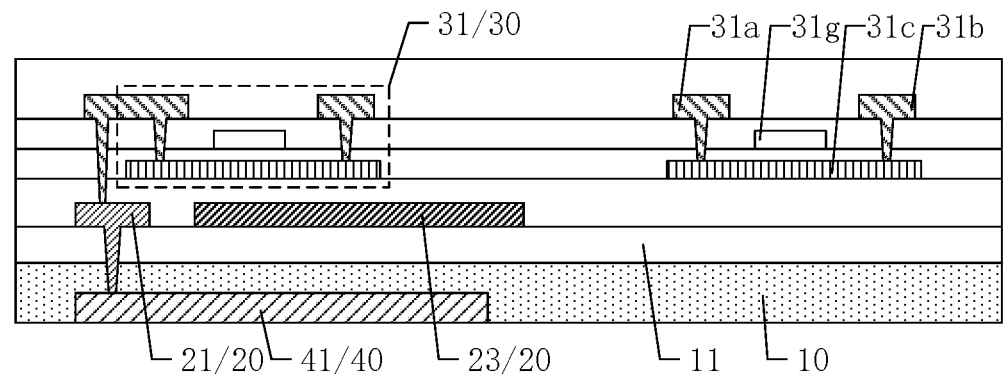

FIG. 28 illustrates a flow chart of another exemplary method for fabricating a display panel according to various embodiments of the present disclosure, and FIGS. 29-31 illustrate schematic cross-sectional views of semiconductor structures at certain stages of the fabrication method illustrated in FIG. 28. Referring to FIGS. 28-31, in one embodiment, in step 104 described above, when patterning the metal wiring layer 20 to form at least one first power-supply line 21, a second blocking section 23 may be simultaneously formed. In the direction perpendicular to the plane of the first flexible substrate 10, the orthogonal projection of the second blocking section 23 may at least partially overlap with the orthogonal projection of the plurality of conductive sections 41.

In one embodiment, the at least one power-supply line 21 of the metal wiring layer 20 and the second blocking section 23 are simultaneously formed through patterning, which may be conducive to simplifying the manufacturing process and improving the production efficiency of the display panel. Moreover, because the orthogonal projection of the second blocking section 23 in the direction perpendicular to the plane of the first flexible substrate 10 at least partially overlaps with the orthogonal projection of the plurality of conductive sections 41, when binding the plurality of conductive sections 41 to the external lines, the second blocking section 23 may be able to effectively prevent the external lines from interfering the signals of devices in the display panel such as the plurality of first thin-film transistors 31, etc., and thus may ensure that the display panel can display picture normally.

The structure arrangement for the second blocking section 23 and the plurality of conductive sections 41 may have different forms, and FIG. 6 and FIG. 8 illustrate two exemplary structure arrangements, respectively. When the sacrificial layer 71 is removed from the plurality of conductive sections 41 and the first flexible substrate 10, the second blocking section 23 may be able to block external light, e.g. laser light, such that desired electrical performance of the first thin-film transistor adjacent to the plurality of conductive sections 41 may be ensured. In some embodiments, As shown in FIGS. 25-27, when patterning the metal wiring layer 20 to form the at least one first power-supply line 21 and the second blocking section 23, the first blocking section 22 may be simultaneously formed, and thus desired electrical performance of the first thin-film transistor 31 may be further ensured.

Figure 32:
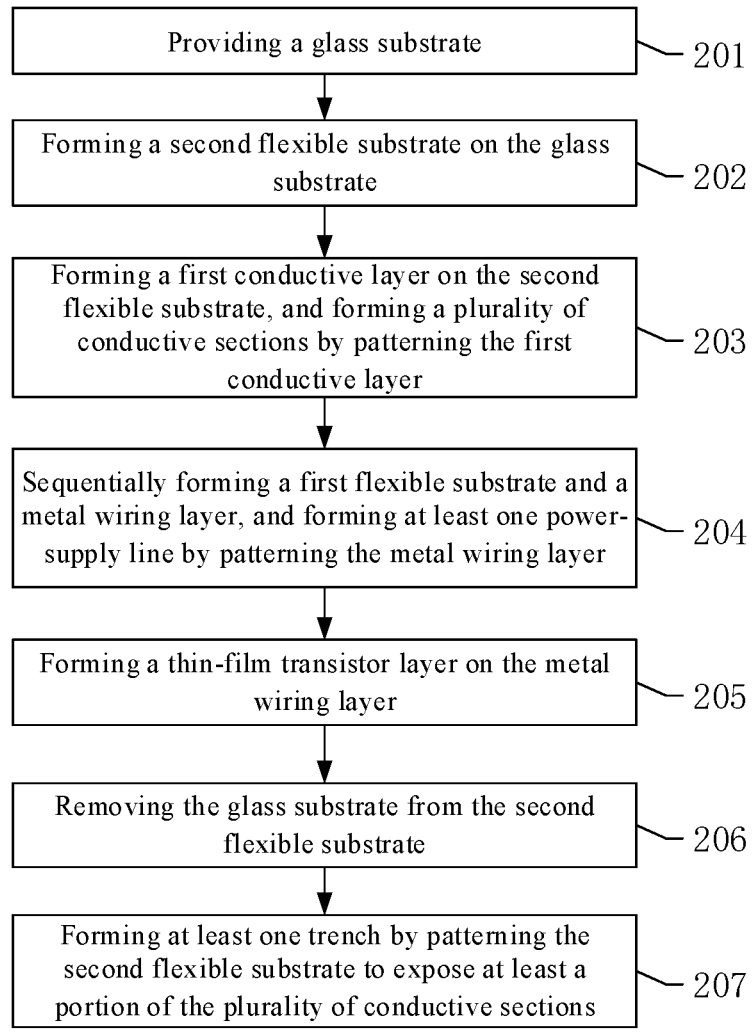
FIG. 32 illustrates a flow chart of another exemplary method for fabricating a display panel according to various embodiments of the present disclosure.
Figure 33:
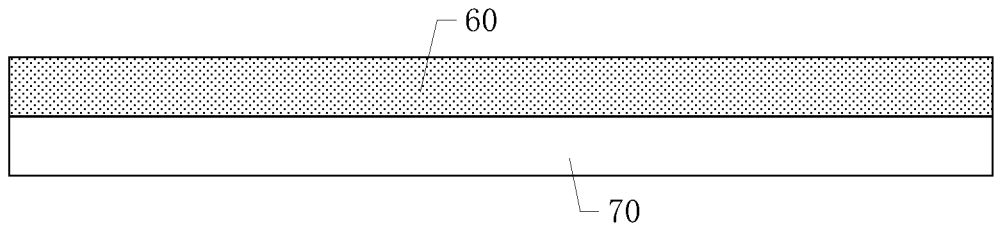
FIGS. 33-37 illustrate schematic cross-sectional views of semiconductor structures at certain stages of the fabrication method illustrated in FIG. 32.
Figure 34:
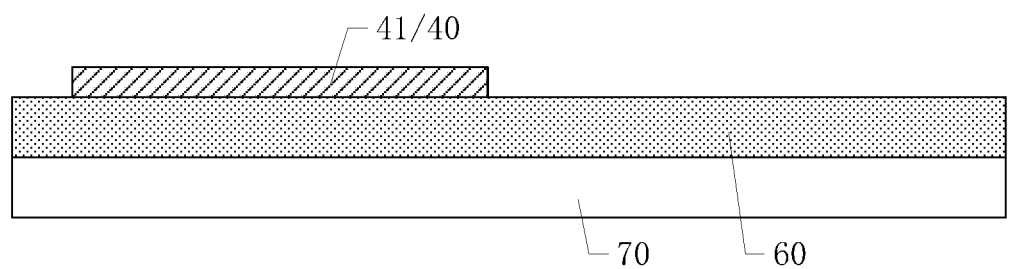
Figure 35:
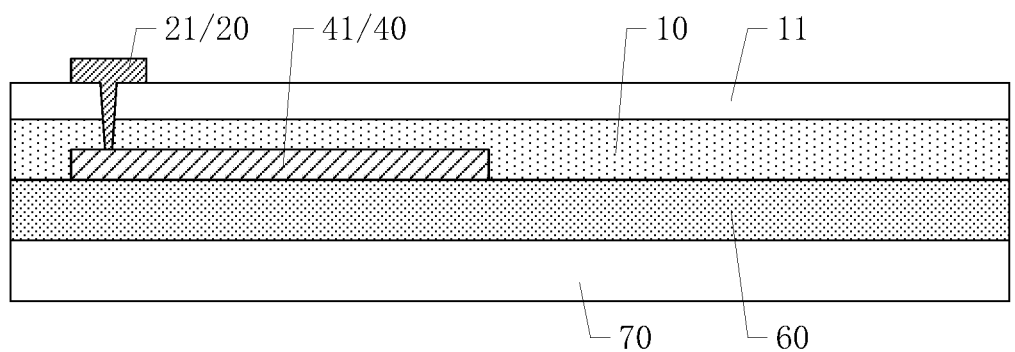
Figure 36:
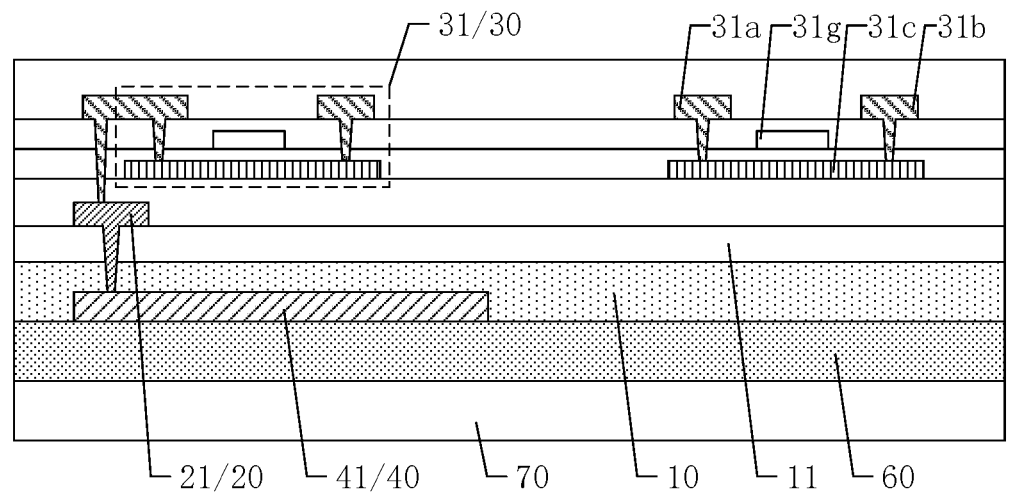
Figure 37:
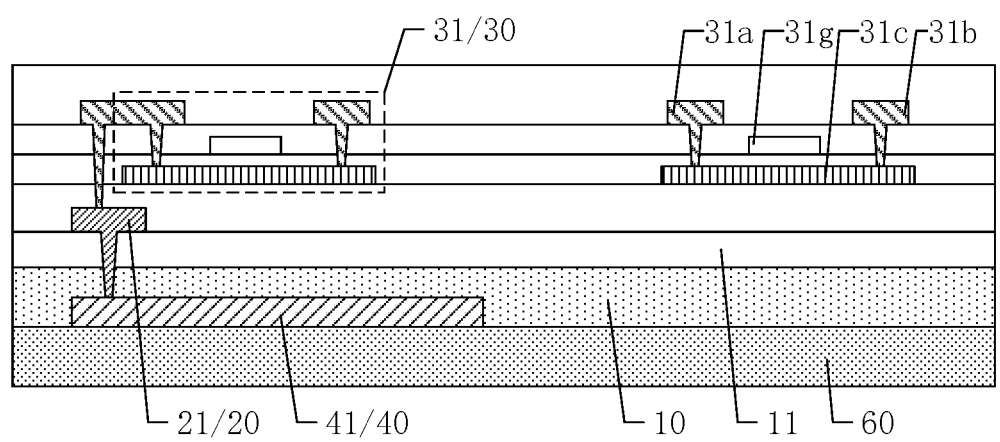

The present disclosure also provides another fabrication method of a display panel. FIG. 32 illustrates a flow chart of an exemplary method for fabricating a display panel according to various embodiments of the present disclosure. FIGS. 33-37 illustrate schematic cross-sectional views of semiconductor structures at certain stages of the fabrication method illustrated in FIG. 32. Referring to FIGS. 1-2, 11, 17, and 32-37, in one embodiment, the method for fabricating the display panel may include the following exemplary steps.

In step 201, a glass substrate 70 may be provided.

In step 202, a second flexible substrate 60 may be formed on the glass substrate 70.

In step 203, a first conductive layer 40 may be formed on the second flexible substrate 60, and a plurality of conductive sections 41 may be formed by patterning the first conductive layer 40.

In step 204, a first flexible substrate 10 and a metal wiring layer 20 may be sequentially formed on the first conductive layer 40, and at least one first power-supply line 21 may be formed by patterning the metal wiring layer 20. At least one binding region B may be disposed on the side of the first flexible substrate 10 that is away from the metal wiring layer 20. The plurality of conductive sections 41 may be located in the binding region B. Each first power-supply line 21 of the at least one first power-supply line 21 may be electrically connected to at least one conductive section 41.

In step 205, a thin-film transistor layer 31 may be formed on the metal wiring layer 20. The thin-film transistor layer 30 may include a plurality of first thin-film transistors 31. A first electrode 31a of each first thin-film transistor 31 may be electrically connected to the at least one first power-supply line 21.

In step 206, the glass substrate 70 may be removed from the second flexible substrate 60.

In step 207, the second flexible substrate 60 may be patterned to form a plurality of trenches 61. The plurality of trenches 61 may expose at least a portion of each conductive section 41.

In one embodiment, the first flexible substrate 10 and the metal wiring layer 20 may be formed sequentially. In some other embodiments, after forming the first flexible substrate 10 and prior to forming the metal wiring layer 20, a buffer layer 11 may be formed on the first flexible substrate 10. For the details of the buffer layer 11, the glass substrate 70, the thin-film transistor layer 30, and the second flexible substrate 60, reference may be made to the corresponding description in the embodiments provided above.

In one embodiment, the second flexible substrate 60 may be directly formed on the glass substrate 70. The adhesion between the second flexible substrate 60 and the glass substrate 70 may be strong, and the strong adhesion may be able to effectively prevent the impact of the removal process on the subsequently-formed film-layer structures such as the first flexible substrate 10, the first conductive layer 40, etc. That is, a layer of protection may be provided to the first flexible substrate 10, which may be conducive to improving the stability of the performance of the display panel and the yield of the product.

When the second flexible substrate 60 is patterned to form the plurality of trenches 61, the number, dimension, and shape of the plurality of trenches 61 may be set according to actual needs. Moreover, after the external lines are bound to the binding region B through the plurality of conductive sections 41, an insulating glue, such as an UV glue, etc. may be filled in the plurality of trenches 61 to provide isolation protection for the electrical connection structure. In the meantime, the second conducive layer 42 may also be properly positioned in the plurality of trenches 61.

It should be noted that, the display panel schematically illustrated in FIG. 11 may be formed through steps 201-207 described above. In addition, different from the film-layer structure of the display panel shown in FIG. 1, the film-layer structure of the display panel shown in FIG. 11 may additionally include a second flexible substrate 60. Therefore, the structural relationship between the binding region B and the plurality of conductive sections 41 may be consistent with that shown in FIG. 2.

In one embodiment, referring to FIGS. 33-37, removing the glass substrate 70 from the second flexible substrate 60 may include performing a laser lift-off process to remove the glass substrate 70 from the second flexible substrate 60.

In one embodiment, separating the glass substrate 70 and the second flexible substrate 60 through a simple and convenient laser lift-off process may be conducive to further improving the production efficiency of the display panel. In the meantime, the second flexible substrate 60 may be able to effectively prevent the impact of the laser lift-off process on subsequently-formed film-layer structures such as the first flexible substrate 10, the first conductive layer 40, etc., and thus the production efficiency of the display panel may be further improved.

Compared to existing display panels, fabrication methods, and display devices, the disclosed display panel, fabrication method, and display device may be able to achieve at least the following beneficial effects.

According to the disclosed display panel and fabrication method, the power-supply line for the first thin-film transistor in the thin-film transistor layer is disposed based on a metal wiring layer. The metal wiring layer is located between the thin-film transistor layer and the first flexible substrate, such that the first power-supply line is able to occupy a sufficient space in the metal wiring layer and thus is less affected by factors such as line arrangement, etc., which may be conducive to reducing the voltage difference in the plurality of first thin-film transistors and improving the uniformity of picture display of the display panel. In addition, the first power-supply line of the metal wiring layer is electrically connected to the plurality of conductive sections located in a binding region. As such, electrical signals can be transmitted between the first power-supply line and the external lines through the plurality of conductive sections, which ensures that the display panel display pictures normally. Moreover, the binding region is disposed on the side of the first flexible substrate that is away from the metal wiring layer, e.g., the region of the display panel used for picture display and the binding region may be disposed in opposite to each other. Therefore, when splicing multiple display panels together, the width of the splicing seam between two adjacent display panels can be small, which is conducive to ensuring the continuity of the picture display and improving the visual effect.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A display panel, comprising:
a first flexible substrate;
a thin-film transistor disposed on a side of the first flexible substrate;
a binding region disposed at a surface of the first flexible substrate away from the thin-film transistor and at a back side of the display panel;
a conductive section disposed in the binding region and electrically connected to the thin-film transistor;
a metal wiring layer including a first power-supply line between the first flexible substrate and the thin-film transistor, and
a second power-supply lines, disposed in a same layer as a first electrode of the thin-film transistor,
wherein:
a width of the first power-supply line is larger than a width of the second power-supply line, and
in a direction perpendicular to a plane of the first flexible substrate, the binding region at the back side of the display panel overlaps a display region for picture display at a front side of the display panel.

2. The display panel according to claim 1, wherein the first power-supply line is electrically connected to the first electrode of the thin-film transistor; and
the first power-supply line is further electrically connected to the conductive section in the binding region at the back side of the display panel.

3. The display panel according to claim 2, wherein:
the metal wiring layer further includes a first blocking section including a first sub-sections, wherein:
the thin-film transistor further includes a semiconductor layer; and
in the direction perpendicular to the plane of the first flexible substrate, an orthogonal projection of the semiconductor layer of the thin-film transistor at least partially overlaps with an orthogonal projection of the first sub-sections of the metal wiring layer.

4. The display panel according to claim 2,
wherein:
the first electrode of the thin-film transistor is electrically connected to the second power-supply lines; and
the second power-supply lines is electrically connected to the first power-supply line through a through hole.

5. The display panel according to claim 4, wherein:
the metal wiring layer further includes a second blocking section; and
in the direction perpendicular to the plane of the first flexible substrate, an orthogonal projection of the second blocking section at least partially overlaps with an orthogonal projection of the conductive sections in the binding region.

6. The display panel according to claim 5, wherein:
the second blocking section includes a second sub-sections; and
in the direction perpendicular to the plane of the first flexible substrate, the second sub-sections of the metal wiring layer and the conductive sections in the binding region are alternately disposed.

7. The display panel according to claim 1, further including:
a second flexible substrate, located on the side of the first flexible substrate away from the thin-film transistor, wherein:
the second flexible substrate includes a trench exposing at least a portion of the conductive sections.

8. The display panel according to claim 1, further including:
a buffer layer, located between the first flexible substrate and the metal wiring layer.

9. A display device, comprising:
the display panel according to claim 1.

10. The display device according to claim 9, further including:
at least one flexible printed circuit (FPC) board, including a second conductive layer, wherein:
the second conductive layer is electrically connected to the conductive sections.

11. The display panel according to claim 2, wherein:
in the direction perpendicular to the plane of the first flexible substrate:
the first power-supply line overlaps the thin-film transistor.

12. The display panel according to claim 2, wherein:
in the direction perpendicular to the plane of the first flexible substrate:
the binding region at the back side of the display panel is fully covered by the display region for the picture display at the front side of the display panel.

13. The display panel according to claim 2, further including:
a light-emitting layer, located on a side of the thin-film transistor away from the first flexible substrate, the light-emitting layer including a light-emitting device electrically coupled to a second electrode of the thin-film transistor.

* * * * *